(12) United States Patent
Singh

(10) Patent No.: US 7,167,593 B2
(45) Date of Patent: Jan. 23, 2007

(54) SYSTEM AND METHOD FOR INCREMENTAL AND CONTINUOUS DATA COMPRESSION

(75) Inventor: Amit P. Singh, Sunnyvale, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

(21) Appl. No.: 11/046,287

(22) Filed: Jan. 27, 2005

(65) Prior Publication Data

US 2005/0169364 A1  Aug. 4, 2005

Related U.S. Application Data

(63) Continuation of application No. 09/872,184, filed on May 31, 2001, now Pat. No. 6,856,651.

(60) Provisional application No. 60/221,262, filed on Jul. 25, 2000.

(51) Int. Cl.
*G06K 9/36* (2006.01)
*G06K 9/46* (2006.01)

(52) U.S. Cl. ............... 382/244; 382/233

(58) Field of Classification Search ........ 382/244, 382/233; 341/95, 51; 375/240, 240.28; 348/384.1
See application file for complete search history.

(56) References Cited

U.S. PATENT DOCUMENTS

| | | | |
|---|---|---|---|
| 4,814,746 A | * | 3/1989 | Miller et al. .......... 341/95 |
| 5,307,413 A | | 4/1994 | Denzer |
| 5,633,871 A | | 5/1997 | Bloks |
| 5,867,114 A | | 2/1999 | Barbir |
| 5,966,385 A | | 10/1999 | Fujii et al. |
| 5,996,022 A | | 11/1999 | Krueger et al. |
| 6,014,712 A | | 1/2000 | Islam et al. |
| 6,100,824 A | | 8/2000 | MacLeod et al. |
| 6,339,595 B1 | | 1/2002 | Rekhter et al. |
| 6,351,465 B1 | | 2/2002 | Han |
| 6,456,209 B1 | | 9/2002 | Savari |
| 6,498,809 B1 | | 12/2002 | Dean et al. |
| 6,584,093 B1 | | 6/2003 | Salama et al. |
| 2002/0044553 A1 | | 4/2002 | Chakravorty |

FOREIGN PATENT DOCUMENTS

WO     WO 00/07124    2/2000

OTHER PUBLICATIONS

Liu, Z. et al., Scalable Robust Efficient Dictionary-Based Compression (SCRIBE), Mar. 22, 2001, [online] [Retrieved on Feb. 21, 2005] Retrieved from the Internet <URL:http://www.watersprings.org/pub/id/draft-liu-rohc-scribe-00.txt>.

(Continued)

*Primary Examiner*—Phuoc Tran
(74) *Attorney, Agent, or Firm*—Shumaker & Sieffert, P.A.

(57) ABSTRACT

A data compression system and method for that is capable of detecting and eliminating repeated phrases of variable length within a window of virtually unlimited size.

15 Claims, 11 Drawing Sheets

OTHER PUBLICATIONS

Nevill-Manning, C. et al., "Compression And Explanation Using Hierarchical Grammers," The Computer Journal, 1997, pp. 103-118, vol. 40, No. 2/3.

Nevill-Manning, C. et al., "Identifying Hierarchical Structure in Sequences: A Linear-Time Algorithm," Journal of Artificial Intelligence Research, Sep. 1997, pp. 67-82, vol. 7.

Nevill-Manning, C. et al., "Linear Time, Incremental Hierarchy Inference For Compression," Data Compression Conference, 1997, DCC '97, Proceedings Snowbird, Mar. 25-27, 1997, Los Alamitos, CA, USA, IEEE Comput. Soc., Mar. 25, 1997, pp. 3-11.

Nevill-Manning, C. et al., "Phrase Hierarchy Inference And Compression In Bounded Space," Data Compression Conference, 1998, DCC '98, Proceedings Snowbird, Mar. 1-Apr. 1998, Los Alamitos, CA, USA, IEEE Comput. Soc., Mar. 30, 1998, pp. 179-188.

Notification Of Transmittal Of The International Search Report Or The Declaration, PCT/US01/22690, Mar. 7, 2002.

Notification Of Transmittal Of The International Search Report Or The Declaration, PCT/US01/23558, Oct. 4, 2001.

Obaidat, M.S. et al., "Verification Of Computer User Using Keystroke Dynamics," IEEE Transactions of Systems, Man and Cybernetics—Part B: Cybernetics, Apr. 1997, pp. 261-269, vol. 27, No. 2.

Supplementary European Search Report of European Application No. 01955862.6, Feb. 22, 2005, 3 pages.

Written Opinion, PCTUS01/23558, Aug. 29, 2002.

Banga, G. et al., "Optimistic Deltas For WWW Latency Reduction," 1997 Annual Technical Conference, Usenix Association, 1997, pp. 289-303.

Chi, C. et al., "Compression Proxy Server: Design And Implementation," Proceedings Of USITS'99: The 2$^{nd}$ USENIX Symposium On Internet Technologies & Systems, The Usenix Association, Oct. 11-14, 1999, 13 pages.

Communication, EP 01959237.7, Jun. 9, 2005, 5 pages.

Heywood, P., "Compression And Routers, Together At Last," International News Analysis, Data Communications, Apr. 24, 1995, pp. 55-56, 61-63, No. 5.

Nand, A. et al., "Mail Servers With Embedded Data Compression Mechanism," IEEE, 1998, p. 566.

Nevill-Manning, C. et al., "Compression And Explanation Using Hierarchical Grammars," The Computer Journal, 1997, pp. 103-116, vol. 40.

Sheu, S. et al., "A Link Level Compression Strategy For High-Speed Backbone ATM Networks," pp. 1-5.

International Search Report, PCT/US02/28905, Jan. 13, 2003, 3 pages.

* cited by examiner

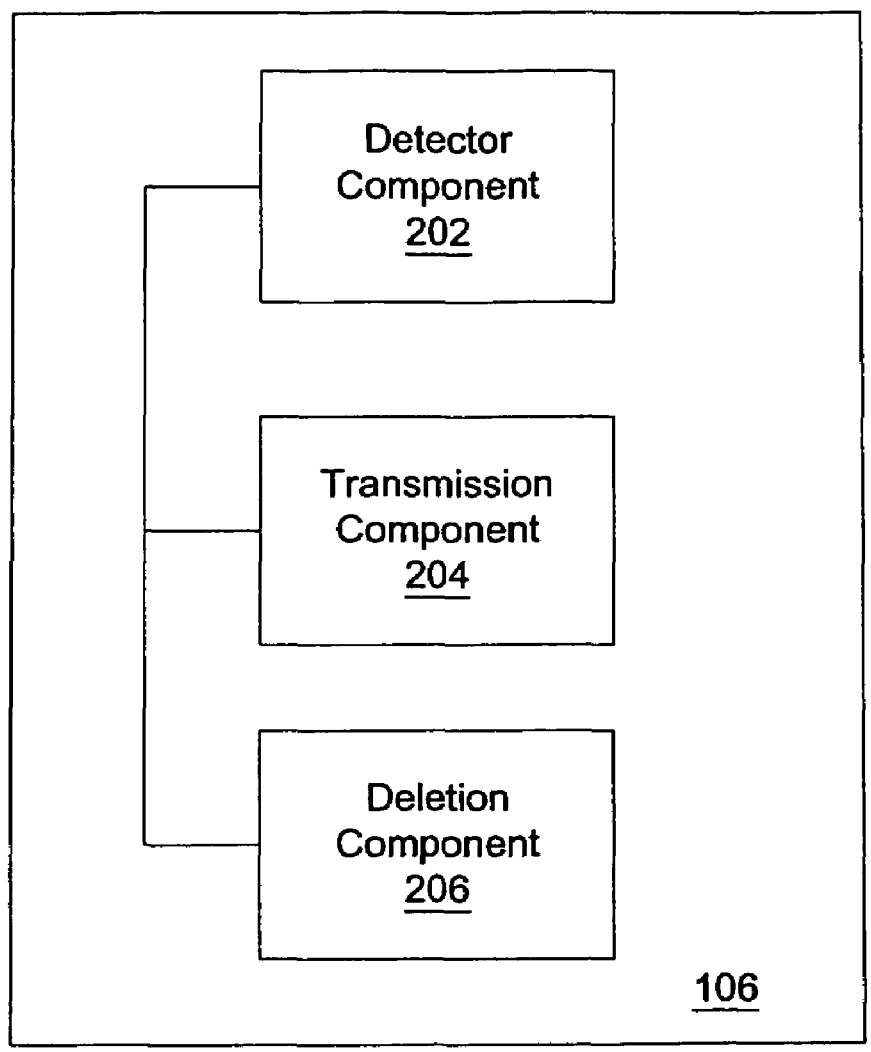
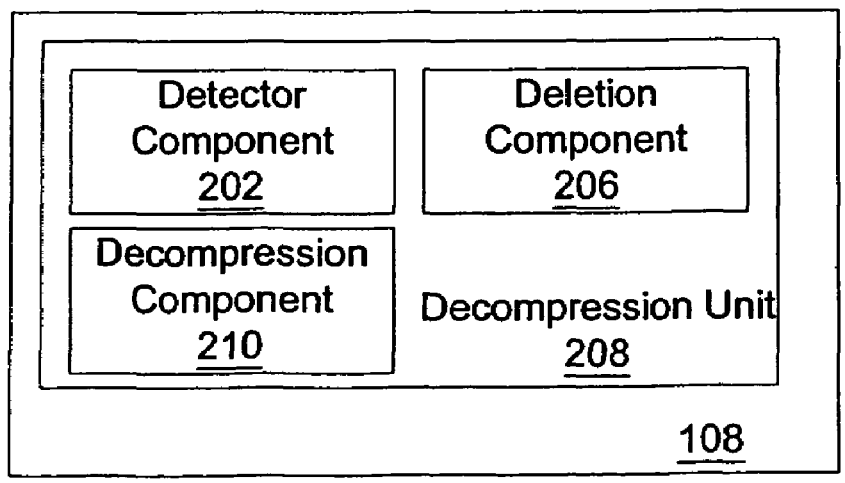
Figure 2

Sequence (S) = abcdcdabcd

| Line | Sequence so far | Compressed Sequence and phrase dictionary | X | Y |
|------|-----------------|-------------------------------------------|-----|-----|
| 1 | S = a | S' = a | – | a |
| 2 | S = ab | S' = ab | a | b |
| 3 | S = abc | S' = abc | b | c |
| 4 | S = abcd | S' = abcd | c | d |
| 5 | S = abcdc | S' = abcdc | d | c |
| 6 | S = abcdcd | S' = abP$_1$P$_1$<br>P$_1$ = cd | P$_1$ | P$_1$ |
| 7 | S = abcdcda | S' = abP$_1$P$_1$a<br>P$_1$ = cd | P$_1$ | a |
| 8 | S = abcdcdab | S' = P$_2$P$_1$P$_1$P$_2$<br>P$_1$ = cd<br>P$_2$ = ab | P$_1$ | P$_2$ |
| 9 | S = abcdcdabc | S' = P$_2$P$_1$P$_1$P$_2$c<br>P$_1$ = cd<br>P$_2$ = ab | P$_2$ | c |
| 10 | S = abcdcdabcd | S' = P$_3$P$_1$P$_3$<br>P$_1$ = cd<br>P$_2$ = ab<br>P$_3$ = P$_2$P$_1$ | P$_1$ | P$_3$ |

Figure 4

Sequence (S) = abababcabc

| Line | Sequence so far | Compressed Sequence and phrase dictionary | Transmitted Contents |
|---|---|---|---|
| 1 | S = a | S' = a | - |
| 2 | S = ab | S' = ab | - |
| 3 | S = aba | S' = aba | - |
| 4 | S = abab | S' = $P_1P_1$ <br> $P_1$ = ab | abab |
| 5 | S = ababa | S' = $P_1P_1$a | - |
| 6 | S = ababab | S' = $P_1P_1P_1$ <br> $P_1$ = ab | - |
| 7 | S = abababc | S' = $P_1P_1P_1$c <br> $P_1$ = ab | - |
| 8 | S = abababca | S' = $P_1P_1P_1$ca <br> $P_1$ = ab | |
| 9 | S = abababcab | S' = $P_1P_1P_1cP_1$ <br> $P_1$ = ab | - |
| 10 | S = abababcabc | S' = $P_1P_1P_2P_2$ <br> $P_1$ = ab <br> $P_2$ = $P_1$c | $P_1cP_1c$ |

Figure 7

SYSTEM AND METHOD FOR INCREMENTAL AND CONTINUOUS DATA COMPRESSION

RELATED APPLICATIONS

This application is a continuation of, and claims priority to U.S. patent application Ser. No. 09/872,184, filed on May 31, 2001 titled "System and Method for Incremental and Continuous Data Compression," now U.S. Pat. No. 6,856,651, which claims priority from U.S. Provisional Application No. 60/221,262, filed on Jul. 25, 2000 titled "System And Method For Incremental And Continuous Data Compression" the contents of which are incorporated by reference herein in their entirety.

BACKGROUND OF THE INVENTION

1. Field of the Invention

The invention relates to the field of data compression and more particularly to the field of incremental and continuous data compression.

2. Description of Background Art

An important goal of conventional communication systems is to improve the bandwidth and throughput of data. Instead of sending every bit of data, conventional systems use compression algorithms to reduce the amount of data that needs to be transmitted from a source to a destination. Two classes of compression algorithms are: loss-less compression algorithms and lossy compression algorithms. Loss-less compression algorithms convert data into a form in which none of the information contained in the data is lost. In contrast, lossy compression algorithms generate a representation in which some details of the data may be excluded.

Compression algorithms can also be divided loosely into two categories: targeted and general purpose. Targeted compression and decompression is applied to data for which a priori knowledge of the data characteristics are available. For instance, video data may be known to consist of individual frames, each of which differs from its previous or subsequent frame by a small amount. In such a case, a targeted compression scheme can take advantage of this a priori knowledge to design a more specific and hence potentially more efficient compression and decompression algorithm. General purpose compression algorithms (also known as universal compression algorithms) do not assume any a priori knowledge of the data characteristics or of the source that is generating the data. General purpose compression is therefore often less efficient, in that it more frequently results in a smaller degree of compression than a targeted compression algorithm for specific types of data. However, general purpose compression algorithms are more flexible because they can be effectively applied to many different types of data and can be applied when information about the data is not known beforehand, as described above.

One class of general purpose compression algorithms is based on the identification and elimination of repetitions in the data. These methods are referred to as dictionary based compression techniques since they attempt to discover a dictionary of repeated terms or phrases. The learned dictionary terms are then used to eliminate repetitions of these terms in a set of target data.

Two other types of compression algorithms are incremental compression algorithms and continuous compression algorithms. These two types of algorithms are not exclusive, i.e., a compression algorithm can be both incremental and continuous. An incremental compression algorithm is an algorithm that does not require processing of either the entire input stream or entire blocks of the input stream in order to generate its output. Instead, an incremental compression algorithm processes the input on a symbol-by-symbol basis (i.e., incrementally) and generates its output while it is still processing its input—rather than after it has processed all of the input. For example, an algorithm that computes the total number of vowels in a piece of text is fundamentally a non-incremental algorithm since it has to process the entire text input to compute the total number of vowels. On the other hand, an algorithm that converts lower case text to upper case can be incremental since it can process each input character independently and can generate its output as it processes each input character.

A continuous algorithm is one that can run indefinitely on an infinite stream of input data without running out of system resources such as memory, disk space, etc. Continuous algorithms are also often referred to as streaming algorithms. Note that a non-incremental algorithm that generates output only after processing all of the input is by definition non-continuous (since the input is infinitely long in the case of continuous algorithms).

The cost of storage and transmission of data is directly correlated with the size of the data object. Hence, removing redundancy from the data is a highly effective means to improving the efficiency of storage and transmission of the data. Most general purpose loss-less data compression algorithms attempt to remove redundancy from data by two principle means: (1) identification and elimination of repeated terms or phrases; and (2) encoding of the data in a more efficient form.

Identification of repeated terms or phrases can be performed by various techniques. The general principle involved can be illustrated by an example. Consider the sequence of characters in equation (1).

$$S=aabcaabdaabeaabf \qquad \text{Equation (1)}$$

A dictionary based compression algorithm could identify that the phrase "aab" is repeated 4 times in this sequence. The sequence could then be more efficiently stored or transmitted if the algorithm replaced all instances of "aab" with a new symbol, e.g., A. The compressed sequence would then look like the sequence in equation (2).

$$S=AcAdAeAf \qquad \text{Equation (2)}$$

In addition to the above compressed sequence, the algorithm would also have to store or transmit an additional instruction to indicate that all instances of A should be replaced by "aab" during decompression. Therefore, the instruction A=aab is the dictionary term upon which the compression is based. The dictionary as well as the compressed string must be stored or transmitted to enable decompression. Though in this case the dictionary was easily determined, it has been shown that for a given input sequence, the problem of finding the dictionary that would yield the highest degree of compression is NP-complete which is described in J. A. Storer, *Data compression via textual substitution*, Journal of the Association for Computing Machinery, 29(4): 928–951 (1982), which is incorporated by reference herein in its entirety.

The encoding of data involves modifying the representation of the data on a per-character basis such that frequently occurring characters can be represented more efficiently (e.g., with a fewer number of bits). Consider the sequence of 14 characters in equation (3).

$$S=abacadaeafagah \qquad \text{Equation (3)}$$

In this case the character "a" occurs 7 times while each of the characters "b–h" each occur only once. If the entire alphabet consisted of only the 8 characters "a–h", they could be represented in binary form using 3 bits per character as illustrated in table 1.

TABLE 1

| | |
|---|---|
| a | 000 |
| b | 001 |
| c | 010 |
| d | 011 |
| e | 100 |
| f | 101 |
| g | 110 |
| h | 111 |

This would result in the sequence (S) requiring a total of 14×3=42 bits. On the other hand, since we can see that the character "a" occurs more frequently in the data, it may be more efficient to represent "a" with fewer bits at the cost of increasing the number of bits for the remaining characters in the alphabet. For instance, the 8 characters could instead be represented as illustrated in table 2.

TABLE 2

| | |
|---|---|
| a | 0 |
| b | 1000 |
| c | 1001 |
| d | 1010 |
| e | 1011 |
| f | 1100 |
| g | 1101 |
| h | 1110 |

In this case, the string S would require 1 bit to represent each of the 7 "a" characters and 4 bits to represent each of the remaining characters. Hence the total space required for S would be 7*1+7*4=35 bits. This represents a savings of over 16 percent.

There are various examples of such statistical coding methodologies, such as Huffman coding and arithmetic coding. A more detailed description of such methodologies is in: D. A. Huffman, *A method for the construction of minimum-redundancy codes, Proceedings IRE*, 40:1098–1101 (1952) and in Witten, Neal, and Cleary, *Arithmetic coding for data compression, Communications of the Association for Computing Machinery*, 30(6):520–540 (1987) which are incorporated by reference herein in their entirety.

A general principle that applies to many such statistical coding techniques was proposed by Shannon in 1948 in Shannon, *A Mathematical Theory of Communication*, Bell System Technical Journal, 27:389–403 (1948) that is incorporated by reference herein in its entirety. Shannon showed that the number of bits required to encode a character or string which occurs with probability P is $-\log_2 P$. Hence, if the eight characters a–h each occurred with equal probability, P=1/8, each character could be encoded in $-\log_2(1/8)=3$ bits. But in our example above, we know that "a" occurs with probability 7/14 while the remaining characters occur with probability 1/14. Hence "a" can encoded in $-\log_2(7/14)=1$ bit, while each of the remaining characters can be encoded in $-\log_2(1/14)=3.8$ bits.

Another coding methodology is run-length encoding. In this case sequences of the same character are replaced by a single instance of the character followed by a number which indicates the number of times the character is repeated. One example is given in equation (4).

$$S=aaaaabbbbb \quad \text{Equation (4)}$$

This string of characters can be encoded using run-length encoding as shown in equation (5).

$$S=a5b5 \quad \text{Equation (5)}$$

Many conventional dictionary based, general purpose, loss-less compression algorithms are based on a combination of the two approaches described above, e.g., first a dictionary based compression of repeated phrases followed by statistical encoding of the resulting compressed stream. Some of these conventional compression techniques are now described.

One conventional compression technique was described in Ziv and Lempel, *A Universal Algorithm for Sequential Data Compression*, IEEE Transactions on Information Theory, IT-23(3):337–343 (1977) which is incorporated by reference herein in its entirety. This widely used dictionary based general purpose compression technique is known as LZ77 and has formed the basis of several other compression algorithms. For instance, the "gzip" compression program, which is widely distributed with UNIX based operating systems, uses a variant of the LZ77 method. LZ77 is based on the use of pointers to previous instances of a phrase within a window of fixed size. Repeated phrases in the data are found by sliding a window across the input sequence and searching for any duplicated strings within the window. For example, consider the input sequence in equation (6).

$$S=abcdefbcdgh \quad \text{Equation (6)}$$

The LZ77 methodology determines that the phrase "bcd" is repeated twice and uses this information to compress the sequence. The first instance of "bcd" is unmodified. The second instance is replaced by a pointer consisting of the distance from the beginning of S to the first instance of "bcd" as well as the length of the repeat. Hence the sequence S would be represented by LZ77 as per equation (7).

$$S=abcdef(1,3)gh \quad \text{Equation (7)}$$

The pointer (1,3) indicates that the phrase starting at distance 1 from the start of the window and extending to the right by 3 characters has been repeated at the current position of the pointer. A variation of this scheme uses the distance back from the current position as the first element of the pointer (instead of the distance forward from the start of the window). In this case S would be represented as per equation (8).

$$S=abcdef(5,3)gh \quad \text{Equation (8)}$$

Here the pointer (5,3) indicates that the phrase starting at distance 5 back from the current position and extending to the right by 3 characters has been repeated.

Conventional LZ77 based compression programs use the above described pointer based methods to convert variable length repetitions into fixed length pointers. The resulting sequence of symbols and pointers is then compressed by applying a statistical coding technique. These programs can use different methods for discovering repeated phrases and encoding the final data stream.

One problem with the LZ77 method is that it is able to detect repetitions only within a window of fixed size. The limited window size prevents detection of repeated data that are separated by a distance larger than the window size. For instance, in the above example if the window size is reduced to 5 characters, the repetition of "bcd" would not be detected since the total distance from the beginning of the first instance of "bcd" to the end of the second distance is greater than 5. The size of the window is limited in LZ77 methods in order to limit the time required to search for repetitions. The complexity and execution time of the search algorithms used with the LZ77 method are typically a function of the size of the input string which is being searched. Conventional LZ77 compression techniques therefore usually limit the size of the window to a few thousand characters. For instance, the "gzip" program uses a window of 32 Kbytes. Increasing the window size would result in a very significant increase in the execution time of the LZ77 algorithm.

Another problem with the LZ77 compression method is that it requires a second stage of statistical coding to provide adequate compression rates. The statistical encoding techniques employed by LZ77 methods are non-incremental and hence non-continuous (e.g., gzip uses Huffman coding which is non-incremental). Non-incremental coding techniques must completely process of a block of data before outputting a coding-tree for that block of data. The block sizes used by non-incremental techniques must also be sufficiently large to ensure that the coding scheme generates an efficient coding tree. LZ77 techniques are therefore not amenable to real-time or on-line compression where there is a continuous stream of data that must be processed incrementally.

Yet another problem with LZ77 techniques is that the number of possible pointers is very large since they can point to any position in the window.

Ziv and Lempell addressed some of the problems with the LZ77 technique in 1978 by proposing a new compression scheme known as LZ78. This is described in Ziv and Lempel, *Compression of Individual Sequences Via Variable Rate Coding*, IEEE Transaction on Information Theory, IT-24(5):530–536 (1979) that is incorporated by reference herein in its entirety. Instead of using pointers to a position in the window, LZ78 methods use an explicit representation of a dictionary of all phrases that are encountered in the input stream. The dictionary is constructed incrementally by building upon previous dictionary terms. Every time a new phrase is seen it is added to the dictionary under the assumption that it may be used in the future. Consider the input sequence in equation (9).

S=cbaabacaccacccaccccc     Equation (9)

LZ78 generates the phrase (0,c) where 0 is the null string and c is the first character. The next two characters will also result in two new phrases (0,b) and (0,a). The final sequence of phrases is illustrated in table 3.

TABLE 3

| Input | Phrase # | Output phrase |
|---|---|---|
| c | 1 | (0,c) |
| b | 2 | (0,b) |
| a | 3 | (0,a) |
| ab | 4 | (3,b) |
| ac | 5 | (3,c) |
| acc | 6 | (5,c) |
| accc | 7 | (6,c) |
| acccc | 8 | (7,c) |

The final encoding of the sequence S will therefore be the column of output phrases shown in table 3. As can be seen in this example, the dictionary entries 1, 2, and 4 are never used in this encoding and are therefore wasted entries in the dictionary. For instance, while the dictionary entry for "ac" is re-used to incrementally generate "acc", "accc", and "acccc", the dictionary entry for "ab" is never used again and is hence wasted.

One problem with the LZ78 technique is that it uses a very aggressive and speculative dictionary construction scheme, which often results in the construction of terms that are not productively used. Hence, the dictionary can become very large and result in an inefficient use of system resources and a decrease in the compression efficiency. In addition, the rate of convergence of the LZ78 scheme is slow because the dictionary grows at a slow rate. LZ78 based compression programs also often use non-incremental statistical coding techniques to improve compression efficiency and program speed and hence cannot be used with on-line or continuous data. Furthermore, there is no provision for forgetting (deleting) phrases or dictionary terms that are no longer used. For a continuous, and potentially infinite stream of data, it is essential not only to dynamically generate new dictionary terms but also to forget terms that are being used infrequently in order to reuse system resources which is not practiced by the LZ78 algorithm. Hence the LZ78 algorithm is not a continuous compression algorithm.

A third type of compression algorithm is the Sequitur algorithm that is described in Nevill-Manning and Witten, *Compression and Explanation Using Hierarchical Grammars*, Computer Journal, 40(2):103–116 (1997) that is incorporated by reference herein in its entirety. The Sequitur algorithm infers a context free grammar from a sequence of discrete symbols. The grammar hierarchically represents the structure of the sequence and can be used to produce useful visual explanations of the structure of the sequence and to infer morphological units in the sequence. Since the grammar fully represents the entire input sequence, Sequitur can also be used for data compression.

Sequitur works by enforcing two constraints on the input sequence. The first constraint is that that no pair of adjacent symbols should appear more than once. The second constraint is that every rule generated by the algorithm should be used more than once. Sequitur applies these constraints by examining the input sequence incrementally and ensuring that both constraints are satisfied at each point in the sequence. For instance, in the input sequence illustrated in equation (10), S=abcdbcabcd     Equation (10)

Sequitur would generate the grammar in equation (11).

S=BAB

A=bc

B=aAd     Equation (11)

where, A and B are rules in the grammar—which are similar to dictionary terms. The above grammar satisfies the first constraint since no pair of symbols appears more than once. The second constraint is also satisfied since both A and B are used at least twice in the grammar.

Since the entire input sequence is represented by the grammar, Sequitur uses this algorithm for compression by applying arithmetic coding to encode the complete grammar. The rules of the grammar (i.e., the dictionary terms) are transmitted by pointers to previous instances of a repeat, which is similar to the technique describe above with reference to LZ77. When a rule is encountered for the first time in the grammar, its contents are transmitted. The second instance of the rule is transmitted as a pointer to the region of the sequence (e.g., the contents of the first instance of the rule) that was used to construct the rule. All further instances of this rule are transmitted as a rule number under the assumption that the decoder and encoder can keep track of each other's rule numbers.

One problem with the Sequitur compression technique is that it is not implicitly incremental. In order to ensure that the grammar is transmitted with the fewest number of symbols, Sequitur requires that the grammar be fully constructed before it is transmitted. Sequitur can be made to appear to be incremental by selecting transmission points along the sequence S at which the probability of transmitting extra symbols is low. The algorithm for detecting whether a certain point in the compressed sequence is a safe point to transmit the sequence requires examining all previous instances of the symbol just before this point. Since Sequitur needs to select these points dynamically throughout the compression of the input sequence, the algorithm incurs a significant amount of extra processing to continuously search for these transmission points. This additional processing (which is necessary to make Sequitur incremental) makes the overall compression algorithm non-linear and hence significantly less efficient.

Another problem with the Sequitur algorithm is that it is not continuous. The algorithm does not provide any means for incrementally transmitting the compressed output while simultaneously deleting rules and symbols that are infrequently accessed (in order to re-use system resources). Hence Sequitur cannot be applied to an infinite or very large stream of input data to generate a continuous stream of compressed output in linear time.

The Sequitur algorithm is also inefficient in its use of system resources since it requires complex data structures to enable the frequent creation and deletion of rules of variable length. In addition, the algorithm is computationally inefficient at detecting long repetitions since each pair of symbols in the repeated phrase requires the creation and deletion of a rule. Hence, each additional instance of the repetition will incur the computational overhead of multiple rule creations and deletions. Sequitur's technique for transmitting the second instance of a rule as a pointer also requires additional processing and memory overheads.

A fourth compression algorithm is the Recursive Pairing (Re-Pair) algorithm that is described in Larsson and Moffat, *Offline Dictionary-Based Compression*, Proceedings Data Compression Conference, 196–305 (1999) that is incorporated by reference herein in its entirety. The re-pair algorithm attempts to compute an optimal dictionary for compression by recursively examining the entire input sequence to identify the most frequently occurring pairs of symbols. At each stage of the algorithm the most frequently occurring pair of symbols is replaced by a new symbol representing a new addition to the dictionary. The entire modified sequence is then examined again to find the current most frequently occurring pair. This process is iterated until there is no pair that appears more than once. The resulting compressed sequence and dictionary is then encoded to generate the final compressed output.

The primary disadvantage of this algorithm is that it is fundamentally non-incremental and non-continuous. The entire input sequence must be processed by re-pair before any output can be generated. The authors themselves describe the algorithm as being an "offline" technique.

What is needed is a data compression system and method that (1) is a general purpose compression algorithm; (2) is a loss-less compression algorithm; (3) does not require a non-linear increase in execution time for a linear increase in data; (4) does not require a limited data window size; (5) is an incremental compression algorithm; and (6) is a continuous compression algorithm.

SUMMARY OF THE INVENTION

The present invention is an efficient compression algorithm that is capable of detecting and eliminating repeated phrases of variable length within a window of virtually unlimited size. The window size is limited only by the amount of available system memory and does not affect the speed of the algorithm. The present invention is a general purpose loss-less compression algorithm that runs in linear execution time, can utilize an unlimited window size, is implicitly incremental, and can be run continuously on a continuous input stream.

BRIEF DESCRIPTION OF THE DRAWINGS

FIG. 2 is an illustration of components of the encoding and encapsulation (EE) unit and the decoding and decapsulation (DD) unit according to one embodiment of the present invention.

FIG. 4 is an illustration of an example of the detection technique according to one embodiment of the present invention.

FIG. 7 is an illustration of an example of the transmission technique according to one embodiment of the present invention.

DETAILED DESCRIPTION OF THE PREFERRED EMBODIMENTS

A preferred embodiment of the present invention is now described with reference to the figures where like reference numbers indicate identical or functionally similar elements. Also in the figures, the left most digit of each reference number corresponds to the figure in which the reference number is first used.

Figure 1:
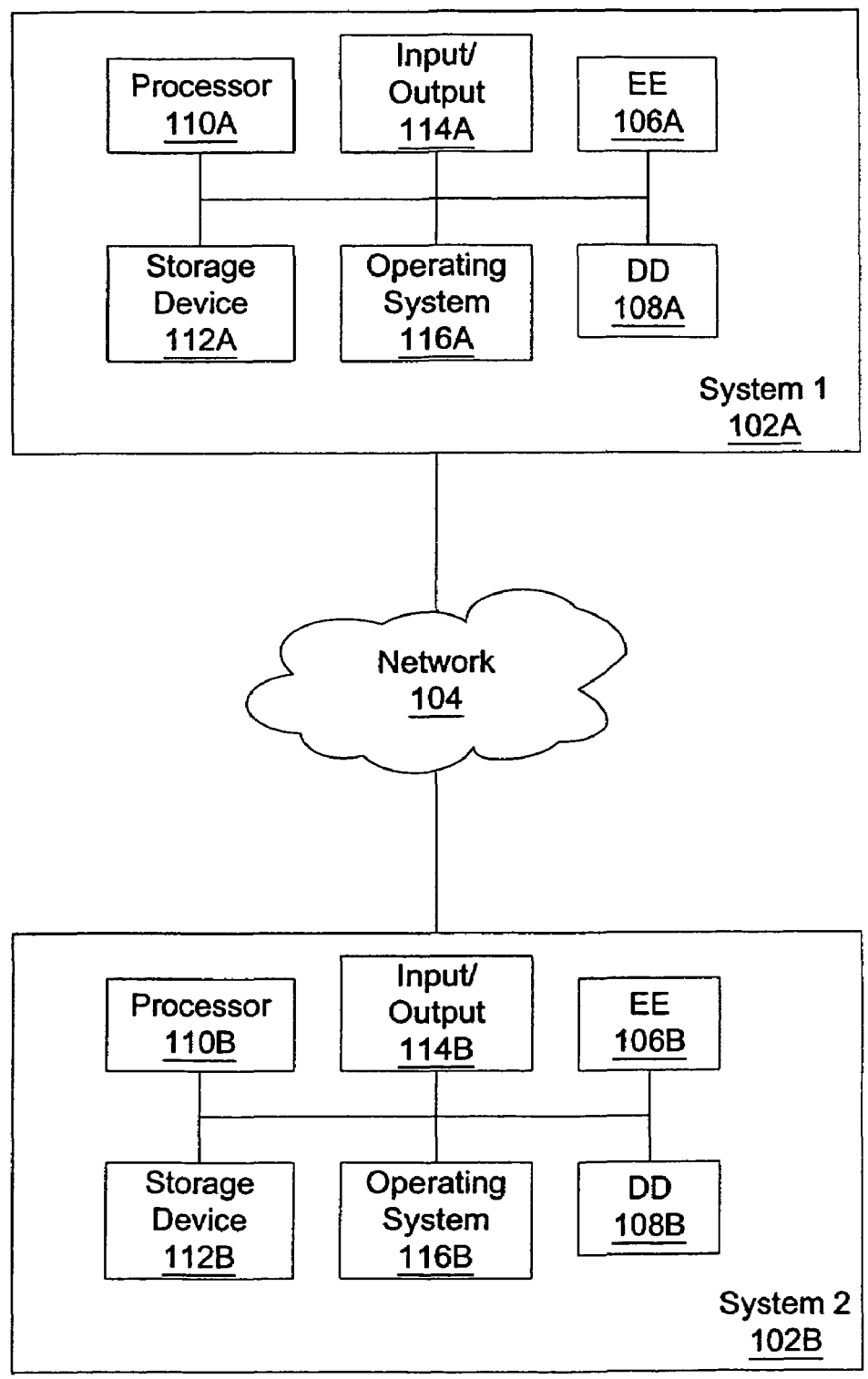
FIG. 1 is an illustration of a computer system in which one embodiment of the present invention may operate.

FIG. 1 is an illustration of a computer system in which one embodiment of the present invention may operate. The computer system 100 includes a first system 102A and a second system 102B. Each system can be a stand-alone computer or a software process. Each system includes conventional processors 110, storage devices 112, input/output devices 114, and operating systems 116. Each system also includes an encoding and encapsulation (EE) unit 106 and a decoding and decapsulation (DD) unit 108. The EE and DD units may be embodied as software running on a processor or as specially designed hardware (in which case the processor may not be necessary). The two systems 102A and 102B may be connected via any physical or logical network link. It is envisioned that the present invention can operate wholly within either of the two systems and the embodiment illustrated in FIG. 1 is exemplary and is not intended to limit the scope of the present invention. The operation of the EE unit 106 and the DD unit 108 are described in greater detail below. For example, in an another embodiment the EE unit 106 and the DD unit 108 may be part of an application specific integrated circuit (ASIC).

The EE unit 106 performs the compression technique of the present invention. The EE unit 106 can be implemented as a computer software program, hardware, firmware, or a combination thereof, for example. In one embodiment, the compression technique of the present invention is implemented in software, stored in a conventional storage module in the EE unit 106 and is executed by the processor 110. The compression technique of the present invention is a linear-time fully-incremental and continuous data compression algorithm. For ease of reference, the algorithm is referred to as "IZ" throughout this document. The decompression aspect of the invention is performed in the DD unit 108 and can be implemented as a computer software program, hardware, firmware, or a combination thereof, for example.

The present invention includes three components that operate synchronously. FIG. 2 is an illustration of components of the encoding and encapsulation (EE) unit 106 and of the decoding and decapsulation (DD) unit according to one embodiment of the present invention. The first component is the detector component 202 that detects repeated phrases/terms anywhere in the input stream in linear time. For the purpose of this patent, the nomenclature of "terms" and "symbols" are used interchangeably. A "phrase" or "data phrase" includes a fixed number of sequential data terms. A data term can be data symbols and/or data phrase identifiers. The detector component 202 incrementally compresses the input stream by identifying and eliminating repeated phrases using a virtually unlimited window size. The processes can be accomplished using an identification unit, a compression unit, and a library building unit (hash building unit) as part of the detector component. The operation of these elements are described below with reference to FIGS. 3 and 4. The second component is the transmission component 204 that transmits the compressed sequence and the associated dictionary of phrases in an implicitly incremental fashion. The transmission component 204 also ensures that the compression and decompression algorithms are always completely synchronized. The third component is the deletion component 206 that allows the IZ algorithm to delete and effectively "forget" phrases and symbols that are infrequently used in order to free system resources. The deletion component 206 therefore enables IZ to run continuously on an infinite stream of input data. The DD unit 108 includes a decompression unit that is described in detail below.

Figure 3A:
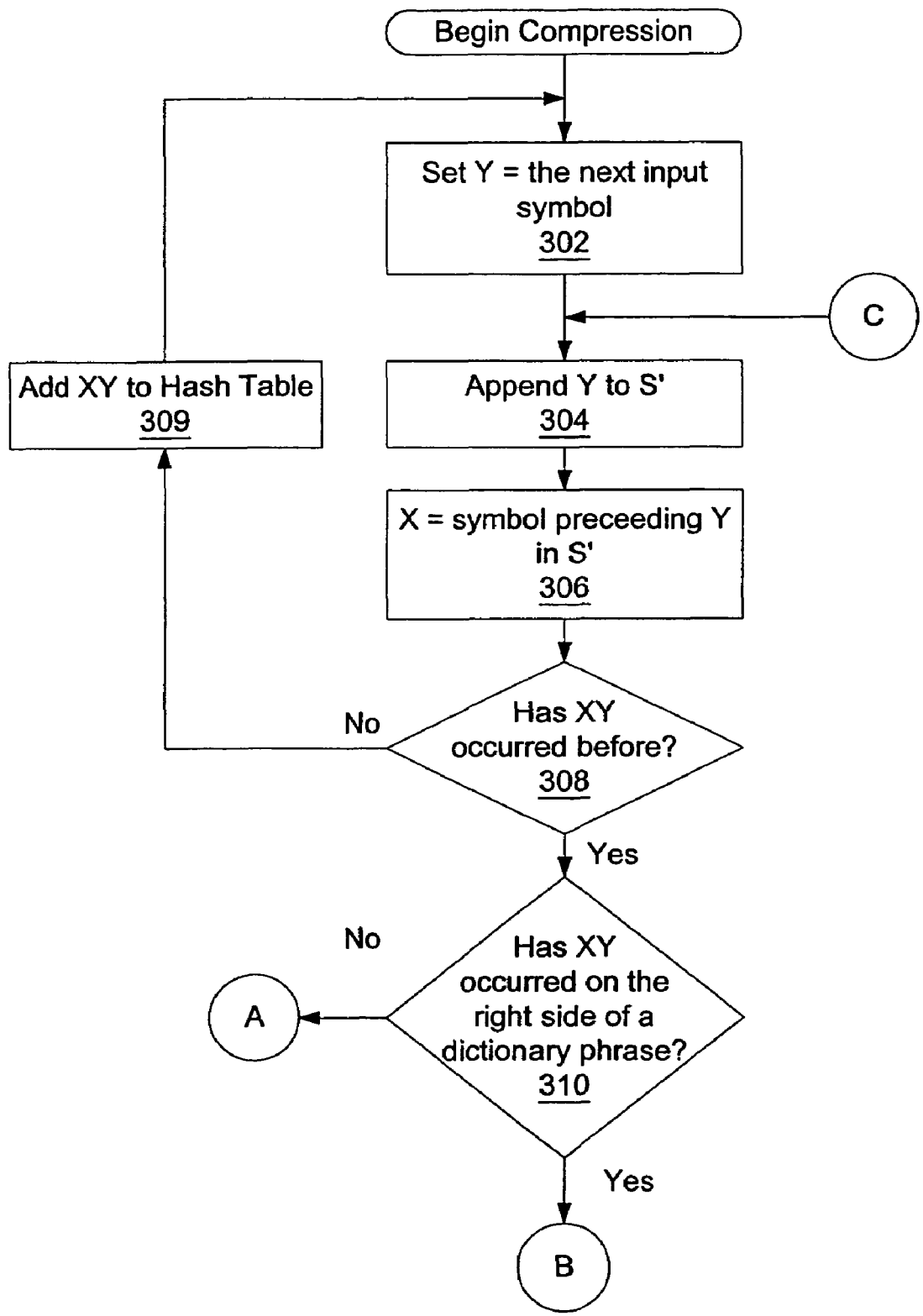
FIG. 3 is an illustration of one embodiment of the detector component of the present invention.
Figure 3B:
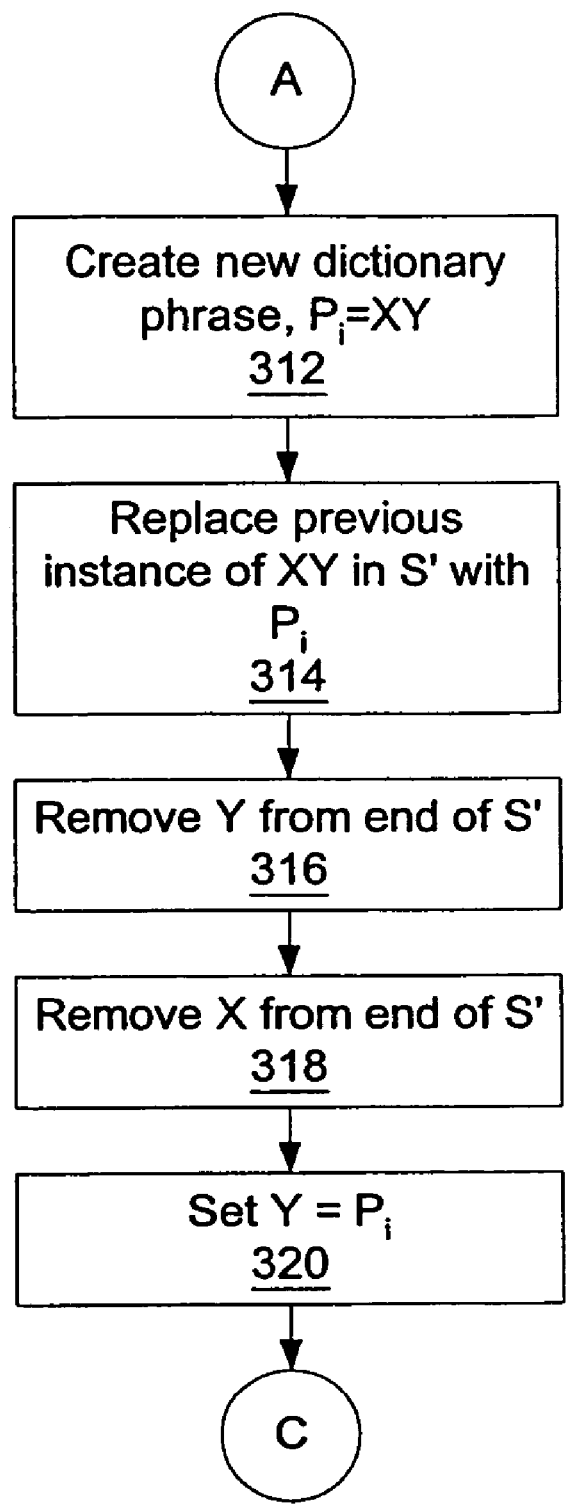
Figure 3C:
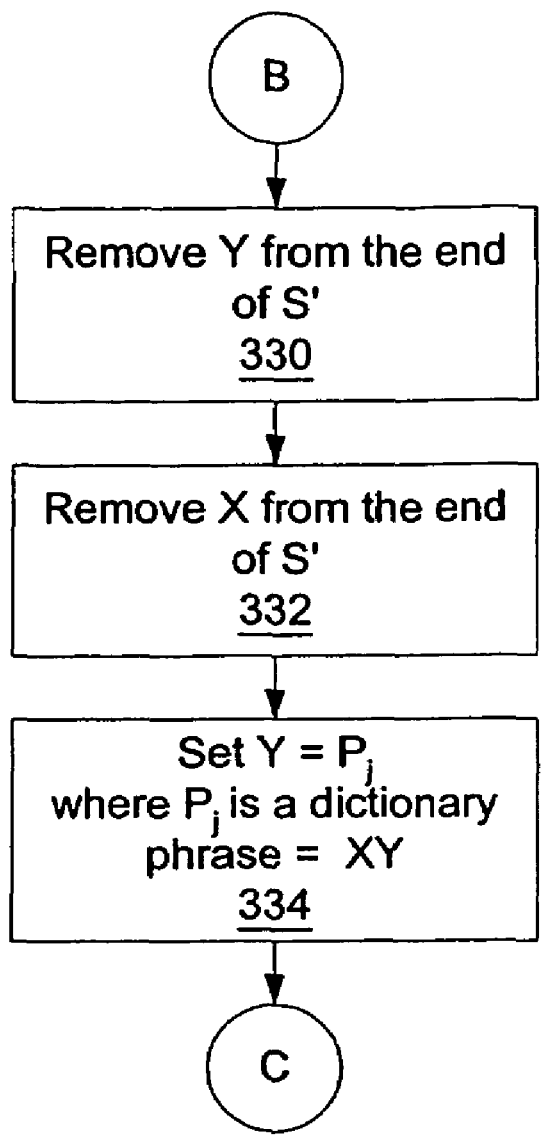

The detector component 202, the transmission component 204 and the deletion component 206 can be implemented in a variety of ways. One implementation of the detector component is illustrated in FIG. 3.

The phrase detection algorithm uses the following steps to incrementally convert an input sequence S into a compressed sequence S'.

The detection of repeated pairs of symbols can be performed by using a hash table (e.g., a library) to record all unique pairs of symbols that have been observed by the detection component 202. Each hash table entry consists of a pointer to the location of the unique symbol pair. If the pair of symbols has only occurred once then the hash table entry for the pair of symbols will point to the location of the first symbol in S'. If the pair of symbols has occurred more than once and is hence represented by a dictionary phrase, then the hash table entry for the pair of symbols will point to the corresponding dictionary phrase. In order to ensure that all repeated pairs of symbols are detected, the algorithm must ensure that each time a symbol is added or deleted from S', the hash table is appropriately updated. For instance, step 314 in the algorithm illustrated in FIG. 3 will result in the addition of new entries to the table. Similarly, steps 314, 318, and 332 will result in the deletion of one or more entries from the hash table.

The flowchart of FIG. 3 will now be described with reference to the example illustrated in FIG. 4.

The input sequence in the example illustrated in FIG. 4 is "abcdcdabcd". In step 302 "Y" is set equal to the next input symbol "a" and is appended 304 to S' (that was previously equal to null). X is then set to the symbol before "a" in the sequence (null). The combination of XY has not occurred 308 previously so XY is added 309 to the hash table and the process repeats at step 302. Line 1 of FIG. 4 shows the status of the example at this point.

Y is then set 302 equal to the next symbol "b", is appended 304 to S' and X is set 306 to the symbol preceding Y ("a"). The combination of XY (ab) has not occurred 308 previously so XY is added 309 to the hash table and the process repeats at step 302. Line 2 of FIG. 4 shows the status of the example at this point.

Y is then set 302 equal to the next symbol "c", is appended 304 to S' and X is set 306 to the symbol preceding Y ("b"). The combination of XY (bc) has not occurred 308 previously so XY is added 309 to the hash table and the process repeats at step 302. Line 3 of FIG. 4 shows the status of the example at this point.

Y is then set 302 equal to the next symbol "d", is appended 304 to S' and X is set 306 to the symbol preceding Y ("c"). The combination of XY (cd) has not occurred 308 previously so XY is added 309 to the hash table and the process repeats at step 302. Line 4 of FIG. 4 shows the status of the example at this point.

Y is then set 302 equal to the next symbol "c", is appended 304 to S' and X is set 306 to the symbol preceding Y ("d"). The combination of XY (dc) has not occurred 308 previously so XY is added 309 to the hash table and the process repeats at step 302. Line 5 of FIG. 4 shows the status of the example at this point.

Y is then set 302 equal to the next symbol. "d", is appended 304 to S' and X is set 306 to the symbol preceding Y ("c"). The combination of XY (cd) has occurred previously so the process continues. Since the previous occurrence of XY was in the sequence S' and not as the right hand side of a dictionary phrase 310, this implies that XY is a new phrase which should be created and added to the dictionary. Hence, the process continues by creating 312 a new dictionary phrase, $P_1$, and setting it equal to XY. In this example, $P_1$ is set equal to "cd". Then the previous instance of XY is replaced 314 in S' by $P_1$. Note that this replacement step 314 results in the removal of two entries from the hash table as well as the addition of two new entries to the hash table. These hash table updates involve the symbol preceding X (call it $X_p$) and the symbol following Y (call it $Y_n$). Since XY is being removed from S', the pair of symbols $X_p X$ and $YY_n$ must also be removed from the hash table. Since XY is being replaced by $P_i$, the pair of symbols $X_p P_i$ and $P_i Y_n$ must be added to the hash table. In this example, "bc" and "dc" are removed from the hash table and "b$P_1$" and "$P_1$c" are added to the hash table. Then Y is removed 316 from the end of S' and X is removed 318 from the end of S'. Again, the removal of X from the end of S' 318 will result in the removal of a symbol pair (corresponding to symbol preceding X and X) from the hash table. In this example, "$P_1$c" will be removed from the hash table. Y is then set equal to P1 and the process continues at step 304. The status of the example at this point is S'=abP$_1$ and Y is equal to P$_1$.

Y is then appended 304 to S' (now S'=abP$_1$P$_1$) and X is set 306 equal to the symbol preceding Y in S' ("P$_1$"). XY (P$_1$P$_1$) has not occurred 308 in the sequence previously so XY is added 309 to the hash table and the process repeats at step 302. Line 6 of FIG. 4 shows the status of the example at this point with S'=abP$_1$P$_1$.

Y is then set 302 equal to the next symbol "a", is appended 304 to S' and X is set 306 to the symbol preceding Y ("P$_1$"). The combination of XY (P$_1$a) has not occurred 308 previously so XY is added 309 to the hash table and the process repeats at step 302. Line 7 of FIG. 4 shows the status of the example at this point.

Y is then set 302 equal to the next symbol "b", is appended 304 to S' and X is set 306 to the symbol preceding Y ("a"). The combination of XY (ab) has occurred previously in the sequence so the process continues. Since the previous occurrence of XY was in the sequence S' and not as the right hand side of a dictionary phrase 310, this implies that XY is a new phrase which should be created and added to the dictionary. Hence, the process continues by creating 312 a new dictionary phrase, P$_2$, and setting it equal to XY. In this example, P$_2$ is set equal to "ab". Then the previous instance of XY is replaced 314 in S' by P$_2$. As before this step will result in the removal of two symbol pairs from the hash table as well as the addition of two new pairs. Then Y is removed 316 from the end of S' and X is removed 318 from the end of S' (which also results in the removal of one symbol pair from the hash table). Y is then set equal to P$_2$ and the process continues at step 304. The status of the example at this point is S'=P$_2$P$_1$P$_1$ and Y is equal to P.

Y is then appended 304 to S' (now S'=P$_2$P$_1$P$_1$P$_2$) and X is set 306 equal to the symbol or term preceding Y in S' (which in this case is actually a data phrase identifier "P$_1$"). XY (P$_1$P$_2$) has not occurred 308 in the sequence previously so XY is added 309 to the hash table and the process repeats at step 302. Line 8 of FIG. 4 shows the status of the example at this point with S'=P$_2$P$_1$P$_1$P$_2$.

Y is then set 302 equal to the next symbol "c", is appended 304 to S' and X is set 306 to the symbol preceding Y ("P$_2$"). The combination of XY (P$_2$c) has not occurred 308 previously so XY is added 309 to the hash table and the process repeats at step 302. Line 9 of FIG. 4 shows the status of the example at this point.

Y is then set 302 equal to the next symbol "d", is appended 304 to S' and X is set 306 to the symbol preceding Y ("c"). The combination of XY (cd) has occurred previously in the sequence so the process continues. Since XY is equal to the right side of a dictionary phrase 310 the process continues by removing 330 Y from the end of S' and removing 332 X from the end of S'. The removal of X 332 from the end of S' will result in the removal of a symbol pair (corresponding to symbol preceding X and X) from the hash table. Then Y is set equal 334 to the dictionary phrase that is equal to XY. In this example, Y is set equal to P$_1$. The process continues at step 304. The status of the example at this point is S'=P$_2$P$_1$P$_1$P$_2$ and Y is equal to P$_1$.

Y is then appended 304 to S' (now S'=P$_2$P$_1$P$_1$P$_2$P$_1$) and X is set 306 equal to the symbol preceding Y in S' ("P$_2$"). The combination of XY (P$_2$P$_1$) has occurred previously in the sequence so the process continues and since XY is not equal to the right side of a dictionary phrase 310 the process continues by creating 312 a new dictionary phrase, P$_3$, and setting it equal to XY. In this example, P$_3$ is set equal to "P$_2$P$_1$". Then the previous instance of XY is replaced 314 in S' by P$_3$. Then Y is removed 316 from the end of S' and X is removed 318 from the end of S'. Y is then set equal to P$_3$ and the process continues at step 304. The status of the example at this point is S'=P$_3$P$_1$ and Y is equal to P$_3$.

Y is then appended 304 to S' (now S'=P$_3$P$_1$P$_3$) and X is set 306 equal to the symbol preceding Y in S' ("P$_1$"). XY (P$_1$P$_3$) has not occurred 308 in the sequence previously so XY is added 309 to the hash table and the process repeats at step 302. Line 10 of FIG. 4 shows the status of the example at this point with S'=P$_3$P$_1$P$_3$. The process can continue for any number of inputs.

The present invention is able to detect repetitions anywhere in the input stream. The present invention does not require an explicit search window and is therefore able to detect repetitions no matter how far apart they occur. Some windowing does get applied in order to make the algorithm continuous as described below, but this window is based on the size of system memory and does not affect the speed of the algorithm. The algorithm described above has been shown to be linear in time and space. The proof of linearity is based on computing the total number of operations required to process a sequence of length n. This number has been shown to be of O(n) (i.e., it is bound by a number proportional to n). Hence, the present invention can detect repeats of variable size across a virtually unlimited window in linear time. The detection of repeated phrases is also more efficient than other techniques, such as the Sequitur technique described above, since IZ does not require any unnecessary creation and deletion of rules for every pair of symbols in the phrase.

Figure 5:
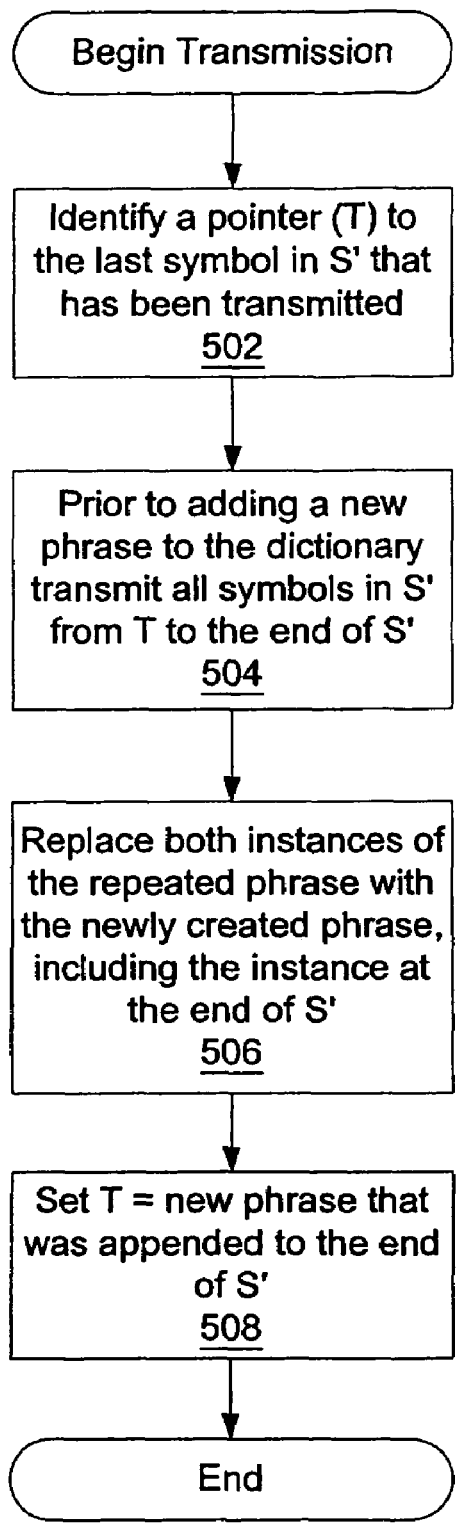
FIG. 5 is a flowchart illustrating the transmission procedure according to one embodiment of the present invention.

The transmission component 204 ensures that both the compressed sequence (S') as well as the dictionary of phrases (P$_i$) are transmitted to ensure accurate decompression. Hence, the transmission component must ensure that the compression unit never transmits a reference to a dictionary phrase that does not exist at the decompression unit and hence cannot be de-referenced by the decompression unit. In order to ensure that the algorithm is completely incremental, IZ uses the following process described in FIG. 5 to transmit S' and the phrase dictionary:

FIG. 5 is a flowchart illustrating the transmission procedure according to one embodiment of the present invention. A pointer (T) is used 502 to point to the last symbol in the compression sequence (S') that has been transmitted. All symbols in S' from T to the end of S' are transmitted prior to the addition of a new phrase in the dictionary, e.g., in step 312 in FIG. 3. Then both instances of the repeated phrase are replaced 506 with the newly created phrase, including the instance at the end of S', e.g., steps 312–320. Then the pointer (T) is set 508 to point to the new phrase that was appended to the end of S'.

The effect of the embodiment illustrated in FIG. 5 is that the first two times that a repeated phrase occurs, it is transmitted unmodified (it is envisioned that other variations occur in alternate embodiments of the present invention, some of which are described below). Since each repetition is composed of nested pairs of symbols, the second instance of the repeated phrase can typically be transmitted more efficiently by directly sending its contents (which includes only two symbols) rather than using pointers, which require additional processing overhead. The decompression algorithm therefore receives the first two instances of the repeated phrase in exactly the same form as the compression algorithm. This allows the decompression algorithm to generate exactly the same dictionary phrase for the repetition as was generated by the compression algorithm. The decompression algorithm utilizes the same phrase numbering technique as the compression algorithm, thereby allowing the compression algorithm to transmit all further instances of the phrase as only a phrase number.

Figure 6:
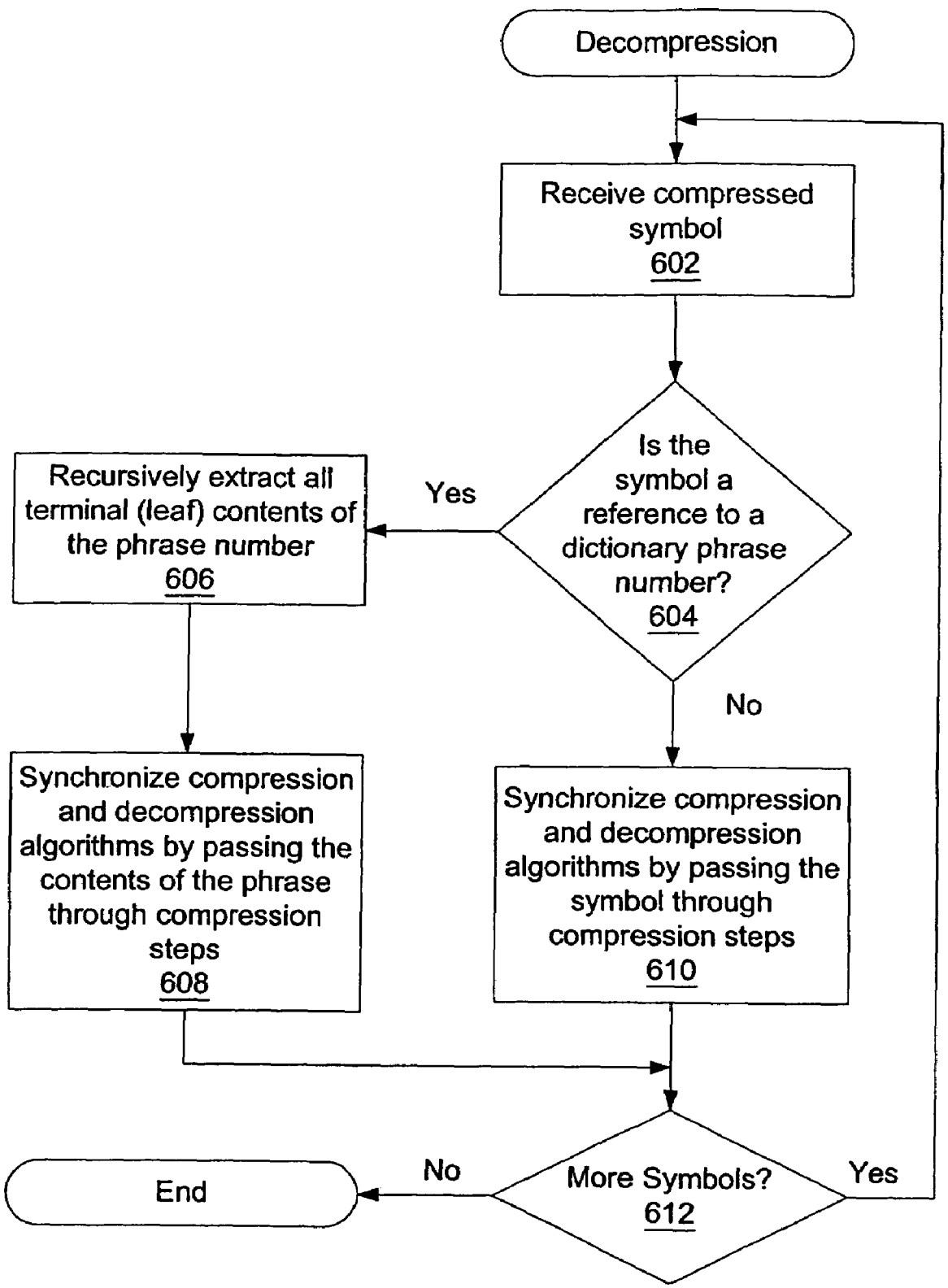
FIG. 6 is a flowchart illustrating the decompression algorithm of one embodiment of the present invention.

The DD 108 includes a decompression unit 208 that includes the decompression algorithm in the form of a computer program, firmware, or hardware, for example, in the decompression component 210. FIG. 6 is a flowchart illustrating the decompression algorithm of one embodiment of the present invention. The decompression algorithm generates the original input stream while simultaneously ensuring that it is completely synchronized with the compression algorithm.

Each compressed symbol is received 602 and the decompression unit 208 determines whether 604 the symbol is a reference to a dictionary phrase number, e.g., $P_i$. If the symbol is such a reference the decompression unit 208 extracts 606 the contents of the phrase number and generates the original input sequence. The decompression unit also then synchronizes 608 the compression and decompression algorithms by passing the contents of the phrase through all the compression steps except for the final transmission step.

If the symbol is not a reference to a dictionary phrase number then the decompression unit 208 passes 610 the symbol through all compression steps (except final transmission) to ensure that the decompression and compression algorithms are synchronized. The process repeats 612 for all received symbols.

Since one embodiment of the present invention transmits the contents required to generate the phrase just before the phrase is generated, it ensures that the decompression algorithm will never receive a reference to a phrase before the decompression algorithm has generated the specific phrase. Thus the compression and decompression algorithms can implicitly ensure that they maintain the same phrase numbering scheme and that their respective dictionaries contain identical information. Note that this implicit dictionary synchronization technique requires that the compressed data that is transmitted by the compression algorithm be received by the decompression unit in exactly the same order as it was transmitted. If for instance some compressed data is received by the decompression unit out of order or if some compressed data is lost, the decompression algorithm may construct a different dictionary than the compression algorithm which may in turn lead to incorrect decompression. Hence, in a network situation the compressed data transmitted between the compression and decompression units must be transmitted within a reliable transport channel.

The IZ algorithm is implicitly incremental since the transmission points are automatically defined by the compression algorithm and do not require the selection of a special algorithm. Hence, there is also no additional computational overhead to select transmission points or to compute the pointers for transmission (as in the case of LZ77 or Sequitur).

FIG. 7 is an illustration of an example of the transmission technique according to one embodiment of the present invention.

In FIG. 7 the sequence of date is "abababcabc". Note that this is different than the example illustrated in FIG. 4. Initially the pointer T is set 502 to a position immediately preceding the position of the first received data. The compression technique described above with reference to FIG. 3 is utilized in this example. Using this compression technique the first new dictionary phrase is added in line 4. However, before adding the new dictionary phrase the transmission component 204 transmits all of the symbols in S' from T to the end of S'. In this example, the transmission includes the symbols "abab" as shown in line 4 of FIG. 7. Then all instances of the repeated phrase are replaced 506 using the technique described in FIG. 3. Then the pointer (T) is set equal to the new phrase just-added. In this example, T is set equal to the second occurrence of $P_1$ in line 4.

The symbols continue to be received and accumulated, i.e., not transmitted, until the sequence at line 10 of FIG. 7 is received. At this time a second phrase is added to the dictionary ($P_2=P_1c$). Prior to adding the second phrase the transmission component 204 transmits 504 all of the symbols in S' from the pointer (T) to the end of S'. In this example the symbols "$P_1cP_1c$" are transmitted. The instances of the new phrase are replaced 506 in S' according to the technique described in FIG. 3 and the pointer (T) is set 508 to the end of the newly added phrase. In this example, T is set equal to the second $P_2$ in S' that is shown in line 10 of FIG. 7. The process continues for any amount of data.

The above transmission procedure implicitly synchronizes the compression and decompression dictionaries and ensures that the decompression unit is always able to de-reference every dictionary phrase that it receives. Another embodiment of this invention uses an explicit dictionary transmission procedure to ensure decompressibility of all phrases. This alternative transmission procedure is based on transmitting phrases to the decompression algorithm in an independent but parallel communication channel. Each time a new dictionary phrase is discovered by the compression algorithm, it is tagged with a flag, "installed=0", indicating that the phrase has not yet been installed in the decompression dictionary. This new phrase number and its contents are transmitted to the decompression algorithm via a reliable transport channel. The decompression algorithm sends back an acknowledgement for each rule that it receives. When the compression algorithm receives an acknowledgement for a phrase, it sets the flag "installed=1" on the phrase to indicate that the phrase has been received and installed at the decompression dictionary. Prior to transmission of any phrase by the compression algorithm, the algorithm checks the "installed" flag. If installed is equal to 0, i.e., FALSE, the contents of the phrase are transmitted. Note that when the contents of a phrase are transmitted, the algorithm must also recursively check the installed flag for any nested phrases in these contents. If installed is equal to 1, i.e., TRUE, the phrase itself is transmitted. By using this alternative explicit dictionary transmission process, the compression algorithm can synchronize the two dictionaries and ensure that the decompression algorithm never receives a phrase that it cannot de-reference. This approach also dramatically changes the structure of the decompression algorithm. Since in this approach the dictionary phrases are transmitted explicitly to the decompression algorithm, it does not need to discover these phrases from the data stream. Hence, the decompression algorithm only needs to de-reference (i.e. decompress) the data it receives and does not need to process the data through the phrase detector and deletion components of the compression algorithm (as was necessary in the previously described implicit dictionary synchronization embodiment). Also note that in this explicit dictionary transmission model dictionary synchronization does not require the compressed data to be transmitted in a reliable transport channel (i.e. a channel that guarantees in-order delivery of all data packets). Since the compressed data is not used to implicitly synchronize the dictionaries, loss of data or out-of-order delivery of data between the compression and decompression units will not result in inconsistent dictionaries and hence not result in inaccurate decompression.

The above explicit dictionary synchronization technique can be further optimized in various ways. For instance, only phrases that have been encountered more than "N" times can be selected for transmission by the compression algorithm. Setting N=1 will result in all phrases being transmitted and hence provide maximum compression and fastest convergence. But at the same time, the additional out-of-band dictionary transmission traffic required to synchronize the two dictionaries will also be maximized. As N is increased, the compression and convergence will decrease but the extra out-of-band dictionary synchronization traffic will also decrease. N can therefore be dynamically selected based on the type of traffic encountered to minimize the total output traffic. Also, if there is any overhead associated with transmission of individual dictionary phrase updates, multiple phrases can be buffered and transmitted together as a single package.

The above explicit dictionary transmission model can also be optimized by eliminating the requirement of an acknowledgement from the decompression algorithm for each dictionary update transmitted by the compression algorithm. In the above embodiment, the compression unit must receive a "phrase received" acknowledgement from the decompression unit in order to change the "installed" flag for the phrase from 0 (i.e., FALSE) to 1 (i.e., TRUE) and hence allow the compression algorithm to utilize the phrase in future compression. This process guarantees that all phrase references that are transmitted by the compression unit in the compressed data can de-referenced by the decompression unit to generate the phrase's original contents. In an alternative embodiment of the explicit dictionary transmission model, the compression algorithm automatically changes the installed flag for a newly transmitted phrase from 0 to 1 after a pre-determined but dynamically adjusted time interval. When a phrase is transmitted from the compression unit (via the independent reliable dictionary transport channel), it is marked locally with a time stamp ($t_0$) indicating the time of transmission. At the same time the "installed" flag for the transmitted phrase is initialized to 0. After a pre-determined time interval (T) the phrase's "installed" flag is changed from 0 to 1, hence allowing the compression algorithm to utilize the phrase for future compression. This mode of dictionary transmission speculates that if a phrase update is transmitted from the compression unit to the decompression unit at time $t_0$, then any compressed data that uses this phrase and is transmitted from the compression unit after time $t_0+T$ will reach the decompressed unit after the phrase update. The time interval T can be adjusted to account for the variability in the rate and latency of data transmission between the compression and decompression units. This speculative dictionary transmission model improves the level of compression since it allows the compression unit to begin using a phrase T seconds after the phrase update is transmitted, instead of having to wait for an acknowledgement for the phrase from the decompression unit. Hence phrases become usable more quickly which yields higher compression.

Since the above speculative dictionary transmission model is based on estimating the variance in transmission time between the compression and decompression units, it is possible for the decompression unit to receive a particular phrase reference in the compressed data before the contents of that phrase have been received via the independent dictionary synchronization channel. When this occurs, the decompression unit transmits a signal to the compression unit indicating that it (i.e., the decompression unit) received a phrase reference via the data channel before the phrase contents were received via the dictionary update channel. The compression unit uses these error signals from the decompression unit to appropriately adjust the time interval (T) between the transmission of a new phrase and the time that the phrase's installed flag is changed to 1.

Another component of the above speculative dictionary transmission model is that the decompression algorithm should be able to detect when it receives a phrase reference that it cannot accurately de-reference. This can be achieved in many ways. One embodiment of the speculative dictionary transmission model maintains a counter for the total number of transmitted and installed phrases at both the compression unit and the decompression unit. Since all phrases are transmitted and received in order (because they are transmitted via a reliable transport channel) these counters can be used to detect if the decompression unit receives a phrase reference via the data channel before the phrase contents have been received via the dictionary synchronization channel. Each phrase at the compression unit is tagged locally with a "local installed counter" based on the current value of the installed counter. Each packet of compressed data that is transmitted from the compression unit is tagged with the maximum value of the "local installed counter" for all the phrases that are referenced in the compressed packet.

This "maximum installed counter" indicates the most recently "installed" phrase that is used in the compressed packet. When the compressed packet is received by the decompression unit, it can detect if the packet contains a non de-referenceable phrase by checking if the "maximum installed counter" is greater than its own current installed counter. If this is the case, then there exists in the compressed packet at least one phrase for which the decompression unit has not yet received the updated contents. This event can then be used to initiate the feedback mechanism described above for sending an error signal to the compression unit. The counters used to count the number of transmitted and installed phrases can eventually reach their maximum value and wrap around back to zero. This case can be handled by ensuring that any "local installed counter" that exceeds the current installed counter is reset to some initial value (possibly 0). The system also ensures that when the transmit counter reaches its maximum value, the compression unit does not transmit any new phrase updates until the phrase corresponding to the maximum counter value is acknowledged by the decompression unit. The decompression unit therefore sends does not need to acknowledge any of the received phrase updates except for the phrase update that corresponds to the maximum received counter.

As described above, in order for a compression technique to run continuously on an unending stream of data without requiring large system resources, the compression system and technique should efficiently and effectively delete phrases and symbols in order to decrease the size of the dictionary. The present invention achieves this goal. That is, since the phrase dictionary as well the compressed sequence S' utilize system resources (such as system memory) to retain their state information, in order to ensure that the present invention can run continuously on an infinite stream of data, it is necessary to provide an efficient means for deleting old phrases from the dictionary as well deleting the oldest regions of the compressed sequence S'. If these "forgetting" (deletion) provisions are not available, the algorithm will eventually run out of system resources and will have to terminate.

Since phrases are hierarchical (i.e., a phrase can contain either input words (symbols) or references to other phrases (data phrase identifiers)), it is not possible to simply delete a phrase without checking to see if it is referenced by any higher-level phrases. For instance, if phrase $P_i$ is referenced by $P_j$ (e.g., $P_j=P_i a$) and $P_i$ is deleted, then any future use of $P_j$ will result in an error. Hence, it is necessary to determine not only which phrases can be deleted but also to ensure that all phrases that reference these phrases are also deleted. The present invention solves both of these problems by representing all phrases in a Least Recently Used (LRU) data structure. In one embodiment of the present invention the LRU is implemented as a linked list and is used to efficiently move a phrase to the front of the list each time it is used during compression. Hence, if a phrase "$P_i$=ab" is in the middle of the LRU and the symbols ab appear in the input stream, $P_i$ is removed from its current position in the list and appended to the current front (or head) of the list. New phrases that are created are also placed at the current front (or head) of the least. At any point in the algorithm, the phrase that is at the end (or the tail) of the list is therefore the least recently used phrase. If it is necessary to delete a phrase to free system resources for reuse, this least recently used phrase should be the first one to be deleted.

Figure 8A:
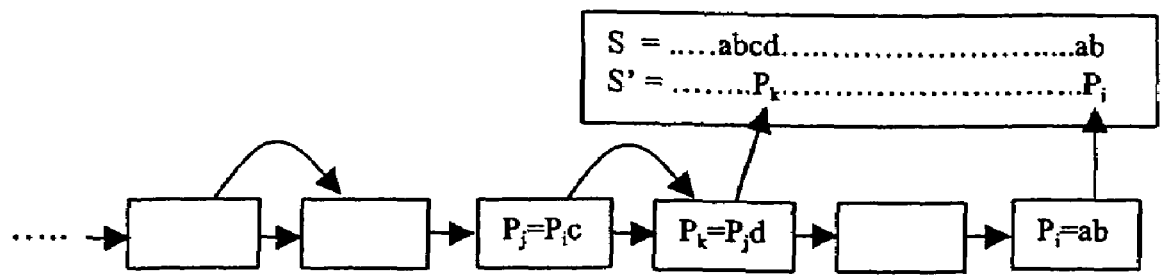
FIGS. 8*a* and 8*b* are illustrations of the LRU and parent pointer example of the deletion technique according to one embodiment of the present invention.
Figure 8B:
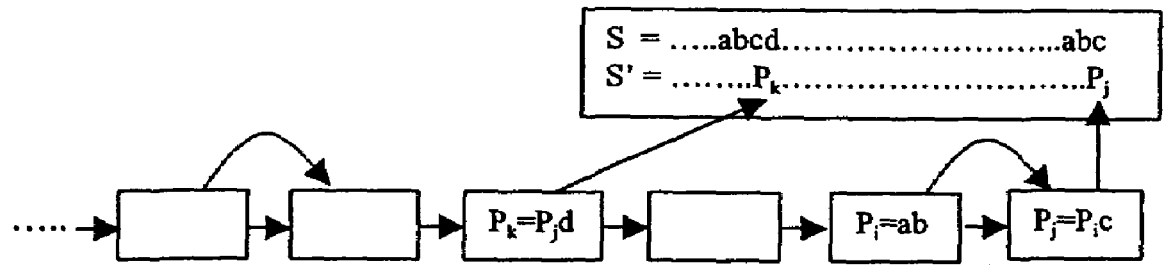

Though the LRU can be used to identify which phrase is to be deleted, it does not indicate which higher-level phrases reference this phrase and therefore must also be deleted. The present invention solves this problem by requiring each phrase to maintain a "parent pointer" which always keeps track of the last time that the phrase was referenced. For instance, if phrase $P_i$ was last referenced by $P_j$ and $P_j$ was last referenced by the compressed string S', then $P_i$ would contain a parent pointer to $P_j$, and $P_j$ would contain a parent pointer to the position in S' where it is being used. FIGS. 8a and 8b are illustrations of the LRU and parent pointer example of the deletion technique according to one embodiment of the present invention.

In FIG. 8a the phrase LRU and parent pointers are illustrated immediately after the arrival of the input symbols "ab."

In FIG. 8b the phrase LRU and parent pointers are illustrated immediately after the arrival of the input symbol "c."

Figure 9:
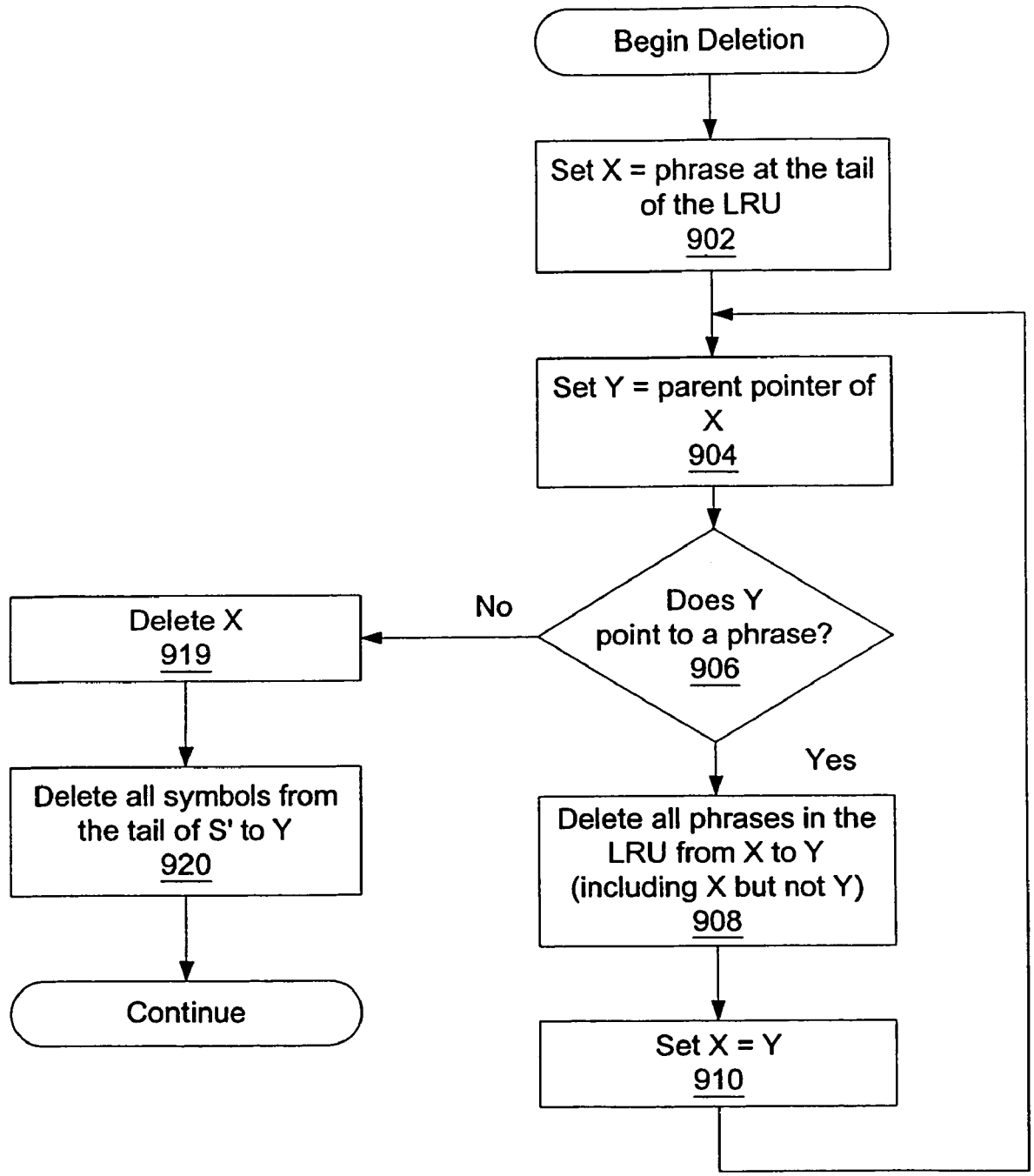
FIG. 9 is a flowchart illustrating the deletion technique according to one embodiment of the present invention.

The data structures illustrated in FIG. 8 allow the algorithm to determine exactly which phrases are referenced by other higher level phrases. Hence, the deletion of a phrase can be performed according to the FIG. 9. FIG. 9 is a flowchart illustrating the deletion technique according to one embodiment of the present invention.

Using the technique illustrated in FIG. 9, X is set 902 to the phrase at the tail of the LRU. Then Y is set 904 to the parent pointer of X. If Y points to a phrase 906, as in FIG. 8a, then all of the phrases in the LRU from position X to Y are deleted 908 (including X but not including Y), X is set 910 to Y and the process repeats at step 904. If Y points to a symbol 906 then the deletion unit 208 deletes 919 X and then deletes 920 all symbols from the tail of S' to Y.

This algorithm recursively ensures that if any phrase is deleted, all references to the phrase in the phrase dictionary and in S' are also deleted. The algorithm also results in the deletion of symbols from the compressed sequence S'. Thus system resources used by infrequently accessed phrases as well as old symbols in S' can be re-used by this technique. If it is necessary to free additional resources, symbols at the tail of S' can also be deleted without the application of the above phrase deletion algorithm. This can be done by simply removing the required number of symbols from the tail of the S' (as long as the symbols have been previously transmitted). If the deleted symbol is a reference to a phrase, then the particular phrase is checked to see whether its parent pointer is pointing to the position of the deleted symbol in S'. If this is the case, then the parent pointer is set to a null value that indicates that the symbol that it is pointing to in S' has already been deleted. Alternatively, the phrase and its descendents (i.e., other phrases that point to it) can also be deleted.

The above phrase and symbol deletion algorithms can be used to set firm limits on the amount of system memory utilized by the system and method of the present invention. Both deletion algorithms incur minimal computational overheads and do not affect the linearity of the IZ algorithm. As the infinite input stream is processed, the continuously running IZ process dynamically selects phrases and symbols for deletion and re-uses the freed resources to ensure that it does not exceed the preset or floating limits.

In the embodiment of the present invention described above a new phrase is created in the dictionary for every pair of symbols that is repeated twice. This can be modified such that a new dictionary phrase is created only when a pair of symbols has been repeated at least k times, where k=3,4,5, etc. This modification would decrease the number of phrases in the dictionary and may increase or decrease compression efficiency.

The data transmitted by the present invention can be statistically encoded using an incremental coding scheme, such as arithmetic coding. This step is often unnecessary since the additional compression gained by statistical coding can be marginal compared to the compression gained by removal of large repeated phrases. For instance, since IZ can replace large repetitions separated by large distances by a single phrase number, a high degree of compression can be gained by detection and elimination of repeated phrases. In such cases, the additional compression gained by coding the compressed sequence will be marginal. Thus the statistical coding and its associated computational overheads can be avoided without any significant decrease in compression efficiency. This is in contrast to other dictionary based techniques that can only detect repeats within a relatively small window and hence obtain a majority of their compression by the statistical coding step. These other programs would therefore suffer a significant decrease in compression efficiency if their output is not statistically encoded.

If the compressed data generated by the current invention is packaged into datagrams before transmission, then the datagrams can be further manipulated by applying other incremental or non-incremental statistical coding or compression techniques (such as Huffman Coding). This could be a post-processing step applied to the output and hence would not affect the incremental nature of the invention.

The current invention logically consists of two communicating modules for each communication channel that is being compressed. The compression module compresses the data at the source of the channel and the decompression module decompresses the data at the destination of the channel. If a single source is communicating with multiple destinations, the invention can be scaled and replicated such that there exists one independent compression module for each destination. All of these compression modules could reside on the same compression unit or device. Similarly if multiple sources are communicating with a single destination, the invention can be scaled and replicated such that there exists once independent decompression module for each source. Again, all of these decompression modules could reside on the same decompression unit or device. Furthermore, multiple compression and decompression modules could reside on the same unit or device, which would then be a combined compression and decompression unit.

The current embodiment of the invention uses independent dictionaries for each compression and decompression module. Another embodiment of the invention uses a shared dictionary between multiple compression modules that co-exist at the same source. This alternative shared dictionary embodiment could utilize the explicit dictionary synchronization technique described above to ensure that the shared compression dictionary is synchronized with each decompression dictionary. The shared dictionary at the compression unit can be implemented by creating a single shared data structure to store all of the phrases that are learned by the compression algorithm. Each phrase also maintains a shared global version number, which is incremented each time the contents belonging to that phrase are deleted and replaced with a newly learned phrase. Thus the detector and deletion components of all the compression units can be shared in this shared dictionary embodiment. Each compression unit has its own individual transmission unit, which maintains independent local phrase version numbers and status flags. When a new phrase reference is passed from the detector component to the transmission component for transmission to the decompression unit, the shared global version number is compared to the local version number which is specific to the given transmission component. If the two numbers are the same, then the transmission component checks its local status flag associated with phrase to determine whether or not the phrase has been transmitted and installed. If the numbers are different, then the transmission component knows that it is a new phrase that has been created by the shared detector component. In this case, the transmission component will reset the status flag to indicate that the phrase has not yet been transmitted and process the phrase based on the above explicit dictionary transmission protocol. This shared dictionary transmission embodiment makes more efficient use of system memory resources since all the compression units that co-exist on the same device share a single phrase hierarchy and symbol data structure. The contents of all phrases are stored only in the shared data structure. Each additional compression unit that is added to the device requires effectively only an additional table of phrase indices to store the local version number and status for each phrase.

The word size used for each input symbol is variable. The present invention has been implemented with word sizes of 1, 2, and 4 bytes, yielding varying results. The word size can also be set to larger than 4 bytes. Larger word sizes yield greater throughput since the speed of the algorithm depends on the number of symbols that it processes. If each symbol corresponds to 4 bytes (i.e. word size=4 bytes) the algorithm will process approximately 4 times the amount of data in any period of time as it would have if each symbol corresponded to 1 byte. On the other hand, using a word size of 4 bytes may prevent the algorithm from detecting repetitions that do not occur on 4 byte boundaries (i.e. repetitions that are separated by a number of bytes that is not a multiple of 4).

The hash functions and tables used in the phrase detection algorithm are flexible. They can be optimized to best the suit the type of data being compressed.

The linked lists used for the phrase LRU and for the compressed sequence S' can be implemented as either singly or doubly linked lists. Other data structures, such as arrays, can also be used and may provide better memory utilization.

As described above, the present invention is an efficient compression algorithm that is capable of detecting and eliminating repeated phrases of variable length within a window of virtually unlimited size. The window size is limited only by the amount of available system memory and does not affect the speed of the algorithm. Instead of using a window size of a few Kbytes, which is commonly used in LZ77 compression techniques, the present invention can use window sizes ranging from tens to thousands of megabytes (limited only by system resources) without any significant change in the speed of the program. Since in the present invention the window consists of only compressed data, the effective size of the window in terms of uncompressed input data can vary and exceed thousands of megabytes (depending on the degree of compression). This dramatic increase in the window size is a significant advantage since it allows the algorithm to detect repetitions that may be separated by large distances. Thus rather than only compressing single files or objects, the present invention can be used to compress any arbitrary collection of multiple files or objects together and thus achieve a significantly higher degree of compression. The present invention can therefore be used to compress a continuous stream of aggregated cross-sessional network traffic where repetitions between different objects or datagrams may be separated by very large amounts of data. The present invention is therefore capable of both intra-object (local) as well as inter-object (global or cross-sessional) compression rather than only intra-object compression.

Another advantage of the present invention is that it is completely incremental and continuous. Hence, the present invention can be applied to an infinite stream of data without risk of algorithm failure or termination. The present invention incrementally processes the input as it arrives and continuously generates output in linear time. The present invention can be configured to always remain within a fixed size of system memory and never exceed this preset limit. The algorithm achieves this continuous and streaming functionality by dynamically deleting phrases and symbols and re-using their resources to learn new dictionary phrases. The algorithm is also adaptive and learns new dictionary phrases to adapt to changes in the input data. This implicitly incremental, continuous, and linear nature of the IZ algorithm (in addition to its virtually unlimited search window size) is a unique feature that is not included in any other general purpose loss-less compression technique.

Another advantage of the present invention is its efficiency. The present invention executes linearly. That is, the execution time does not increase non-linearly (eg. exponentially) as the amount of input data increases. The linearity of the present invention is not compromised by the incremental transmission and continuous phrase/symbol deletion components of the program. The linearity is also not affected by the size of window from which the repetitions can be detected. Thus any input stream can be compressed by the present invention in a time proportional to the size of the input. In addition, since the present invention uses a hierarchical representation of phrases, the entire dictionary can be stored more efficiently than other dictionary based techniques (e.g., LZ77). The present invention only adds phrases to the dictionary when they have been seen more than once. Hence, dictionary entries are better utilized than in LZ78, which uses a more aggressive and speculative dictionary construction technique. The present invention is also more efficient than other hierarchical rule based techniques since it does not require any additional processing to select incremental transmission points (such as Sequitur's computationally intensive algorithm for selection of transmission points).

The implicit transmission of dictionary phrases by the present invention is also more efficient than other pointer based techniques (such as LZ77 and Sequitur) since the present invention does not require the use of markers or other means to compute and transmit starting positions for each pointer. The data structures used by the present invention to represent phrases and symbols are also more memory efficient than those used by Sequitur. In addition, the repetition detection algorithm of the present invention is more efficient at detecting long repetitions than Sequitur since the present invention does not require continuous creation and deletion of phrases as the repeated phrase is extended.

The present invention is the only general purpose loss-less compression algorithm to combine the four advantages described above, i.e. linear speed, virtually unlimited window size, implicit incrementality, and fully continuous compression. These four advantages allow the present invention to be used in a wide array of fields where compression has not previously been successfully applied. For instance, the invention can be used to compress streams of network data by detecting and eliminating the transmission of similar or identical objects or datagrams. The invention can be used to improve bandwidth utilization across any two communicating nodes in a network. Any network architecture where similar or identical objects are being transmitted can significantly benefit from this invention. For instance, world wide web traffic emerging from a content provider often contains identical or similar objects that are transmitted to different users. In this case the invention can be used to converge and compress the data being sent to the different users and thus dramatically decrease the bandwidth required to transfer the data across the Internet. The decompression algorithm can pick up the compressed stream at a site closer to the end users and expand it to its original size before sending the data to the users. This will result not only in a dramatic decrease in bandwidth utilization between the compression and decompression sites, but also result in a significantly faster delivery of data to the users. There are several other network situations where the present invention provides significant value, such as in compressing data being transmitted across private line networks or virtual private networks. In addition, the present invention can be used to efficiently compress entire databases for more efficient storage and transmission.

In all of these cases the Invention will provide additional value over other compression techniques since it can achieve both inter-object and intra-object (cross-sessional) compression in linear time. All of these applications and benefits are possible due to the fact that the Invention runs in linear time, utilizes a virtually unlimited window size, is implicitly incremental, and can be run continuously on an infinite input stream.

While the invention has been particularly shown and described with reference to a preferred embodiment and several alternate embodiments, it will be understood by persons skilled in the relevant art that various changes in form and details can be made therein without departing from the spirit and scope of the invention.

What is claimed is:

1. A method comprising:
receiving a data stream at a compression device;
detecting repeated data phrases in the received data stream, wherein each data phrase comprises a set of sequential data symbols within the data stream;
sending a set of library phrases associated with the repeated data phrases to a decompression device; and
sending a data phrase identifier associated with any of the library phrases in the set prior to receiving an acknowledgement from the decompression device that the set of library phrases was received.

2. The method of claim 1, further comprising:
wherein sending a data phrase identifier prior to receiving an acknowledgement comprises waiting a time interval before sending the data phrase identifier; and
sending the data phrase identifier upon expiration of the time interval even when the acknowledgement from the decompression device was not received within the time interval.

3. The method of claim 2, further comprising:
receiving an error signal from the decompression device indicating that the data phrase identifier was received by the decompression device before the set of library phrases; and
dynamically adjusting the time interval in response to the error signal.

4. The method of claim 3, wherein dynamically adjusting the time interval comprises setting the time interval as a function of a number of error signals received from the decompression device.

5. The method of claim 1, further comprising setting a time stamp indicating a time at which the set of library phrases is sent.

6. The method of claim 1, further comprising:
maintaining a counter for a total number of transmitted and installed library phrases;
locally tagging each library phrase with a local installed counter based on the current value of the maintained counter;
tagging a packet of compressed data with a maximum value of the local installed counter for all of the library phrases referenced by any data phrase identifiers in the packet; and
sending the packet of compressed data to the decompression device.

7. The method of claim 6, further comprising:
receiving the packet of compressed data at the decompression device;
determining that the maximum value tagged on the received packet is greater than the value of the maintained counter; and
sending an error signal in response to the determination.

8. A method comprising:
receiving a stream of compressed data at a decompression device, wherein the stream includes data phrase identifiers associated with library phrases, the library phrases stored at the decompression device;
maintaining a counter for a total number of received library phrases;
determining that the stream includes at least one data phrase identifier for which an associated library phrase is not stored at the decompression device when a maximum value tagged on a packet received in the stream is greater than a value of the counter; and
sending an error signal from the decompression device to the compression device in response to the determination.

9. A compression device comprising:
a compression unit that receives a data stream and detects repeated data phrases in the received data stream, wherein each data phrase comprises a set of sequential data symbols within the data stream; and a transmission component to send a set of library phrases associated with the repeated data phrases to a decompression device and send a data phrase identifier associated with any of the library phrases in the set prior to receiving an acknowledgement from the decompression device that the set of library phrases was received.

10. The compression device of claim 9, wherein the transmission component waits a time interval before sending the data phrase identifier, and sends the data phrase identifier upon expiration of the time interval even when the acknowledgement from the decompression device was not received within the time interval.

11. The compression device of claim 10, wherein the compression unit receives an error signal from the decompression device indicating that the data phrase identifier was received by the decompression device before the set of library phrases and dynamically adjusts the time interval in response to the error signal.

12. The compression device of claim 11, wherein the compression unit sets the time interval as a function of a number of error signals received from the decompression device.

13. The compression device of claim 9, wherein the compression unit sets a time stamp indicating a time at which the set of library phrases is sent.

14. A decompression device comprising:
a decompression unit that receives a stream of compressed data, wherein the stream includes data phrase identifiers associated with library phrases;
a data structure for storing the library phrases;
a counter that indicates a total number of received library phrases, wherein the decompression unit determines that the stream includes at least one data phrase identifier for which an associated library phrase is not stored at the decompression device when a maximum value tagged on a packet received in the stream is greater than a value of the counter, and sends an error signal from the decompression device to the compression device in response to the determination.

15. A method comprising:
receiving a data stream at a compression device;
detecting repeated data phrases in the received data stream across a window size limited only by the amount of memory of the compression device; and
continuously and incrementally generating a compressed data stream with the compression device by replacing a repeated phrase with a data phrase identifier associated with a library phrase of the repeated phrase,
wherein the compression device generates the compressed data stream linearly in time and space.

* * * * *